(12) United States Patent
Hollmer et al.

(10) Patent No.: US 6,222,768 B1
(45) Date of Patent: Apr. 24, 2001

(54) AUTO ADJUSTING WINDOW PLACEMENT SCHEME FOR AN NROM VIRTUAL GROUND ARRAY

(75) Inventors: Shane Hollmer, San Jose; Pau-Ling Chen, Saratoga, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/557,832

(22) Filed: Apr. 26, 2000

Related U.S. Application Data
(60) Provisional application No. 60/178,605, filed on Jan. 28, 2000.

(51) Int. Cl.$^7$ ................................................. G11C 16/04
(52) U.S. Cl. ................................ 365/185.16; 365/185.33
(58) Field of Search .................... 365/185.16, 185.33, 365/185.18, 185.29, 185.24, 185.14

(56) References Cited

U.S. PATENT DOCUMENTS

| | | | |
|---|---|---|---|
| 4,173,766 | 11/1979 | Hayes | 357/23 |
| 5,280,446 | 1/1994 | Ma et al. | 365/185 |
| 5,349,221 | 9/1994 | Shimoji | 257/324 |
| 5,644,532 | * 7/1997 | Chang | 365/185.16 |
| 5,768,192 | 6/1998 | Eitan | 365/185.24 |
| 5,825,686 | 10/1998 | Schmitt-Landsiedel et al. | 365/185.03 |
| 5,847,998 | 12/1998 | Van Buskirk | 365/185.33 |
| 5,867,430 | 2/1999 | Chen et al. | 365/189.04 |

FOREIGN PATENT DOCUMENTS

| | | |
|---|---|---|
| 2 157 489 | 10/1985 | (GB) . |
| WO 99/07000 | 2/1999 | (WO) . |

* cited by examiner

*Primary Examiner*—David Nelms
*Assistant Examiner*—David Lam
(74) *Attorney, Agent, or Firm*—Brinks Hofer Gilson & Lione (57) ABSTRACT

A virtual ground array based flash memory device includes a virtual ground array containing individual memory elements with supporting input/output circuitry. The threshold voltages of the memory elements gradually increase over operating cycles due to trapping of charge in the nitride or oxide, eventually causing errors due to the increase in threshold voltage. Internal routines are necessary to characterize the change in threshold voltages and subsequently modify the comparison circuit supplying the current used to determine whether the memory elements have attained a specific threshold. The method of automatically adjusting the window of the virtual ground array increases endurance and reliability of the virtual ground array and decreases errors caused by the increased threshold voltage.

10 Claims, 5 Drawing Sheets

AUTO ADJUSTING WINDOW PLACEMENT SCHEME FOR AN NROM VIRTUAL GROUND ARRAY

RELATED APPLICATION

This application is based on Provisional Application Ser. No. 60/178,605 filed Jan. 28, 2000, which is incorporated herein by reference.

FIELD OF THE INVENTION

The present invention relates to the field of flash memory devices. More particularly, the invention relates to a method for auto adjusting window placement for an NROM virtual ground array.

BACKGROUND OF THE INVENTION

The overall array architecture for a typical virtual ground array based flash memory device includes a virtual ground array accessed by a set of row decoders and a set of column decoders/multiplexors. The virtual ground array contains information stored in individual memory elements. The row/word-line decoders are used to access specific memory rows within each memory block and the column decoder/multiplexor provides the input and output circuitry for each memory element.

The architecture of a virtual ground array comprises both individual memory elements and select gates. The memory elements are embodied in non-volatile transistors that may be programmed to a logic state of 0, 1, or other states depending on the particular type of transistor and programming used. The select gates are embodied in normal MOSFETs. Selectable word lines address both the control gates of the transistors that comprise the individual memory elements and select gates in the virtual ground array. Sets of memory elements are connected in series along each word line. The select gates are connected in pairs that are coupled to alternate select gate address lines. The pairs of select gates are connected with pairs of memory elements and a global bitline. Multiplexors control the columns that are connected to the external circuitry, such as the sensing circuitry and data-in path. The multiplexors are controlled by a set of column address decoders. Thus, the decoders and multiplexors regulate the flow of data into and out of the virtual ground array.

Variations of the threshold voltage of the individual memory elements within the virtual memory array occur as a result of continual erasing and programming over time of the memory device. After an erase/program operation on memory elements in the array it is necessary to verify that the memory elements have been erased or programmed to the correct level. The levels may be determined by using a safe and accurate sensing scheme that senses from the source rather than the drain side of the virtual ground array. Using the drain side has a number of disadvantages. The main disadvantage of drain side sensing is that all the other bitlines connected with memory elements on the drain side not being sensed must be precharged to the drain voltage or higher before the sensing routine commences. Precharging the bitlines, in this case, wastes both time and power. Time is necessary to initiate, perform, and verify the precharging sequence when sensing from the drain side. Excess power is consumed in each of the precharge steps as well, for example decreasing battery lifetime for any portable electronics unit using the virtual ground array. In addition, sensing from the drain side leads to larger leakage currents and more thus error. Further, once it has been determined that the levels have deviated significantly from previous values necessary for normal operation, the window of operating voltages must be altered to decrease any errors obtained during normal operations due to the change.

BRIEF SUMMARY OF THE INVENTION

In view of the above, a method for automatically adjusting the placement of a window of threshold voltages for verification during operation in a virtual ground array is provided.

A first aspect of the invention is directed to a method of automatically adjusting the placement of the window. The method comprises selecting a set of memory elements contained in the virtual ground array. The selected memory elements may be erased or programmed. The placement of a window of operating voltages is adjusted in response to the source current from a selected memory element in the set. The window of operating voltages has a range of operating voltages containing, in order of increasing voltage, an erase voltage, a read voltage, and a program voltage of the selected memory element. The verification and adjustment occurs for each memory element in the set of memory elements.

The source current may be determined by transforming the source current into a sense voltage via a sense transforming means. In addition, a reference current must then be transformed into a reference voltage via a reference transforming means, and the sense voltage and reference voltage comparing via a comparator. The reference current originates from one of set of reference sources. Either (or both) transforming means may be controlled and may be comprised of capacitors, resistors, or transistors.

The adjustment may be accomplished by a number of acts. These acts may include verifying that the selected memory element was erased to a sufficient erase voltage and determining the number of verifications when the selected memory element was not erased to the sufficient erase voltage. When the number of verifications is smaller than a predetermined amount, the selected memory element is properly erased. When the number of verifications is larger than the predetermined amount of verifications, the number of programmings applied to the reference source is determined. When the number of programmings is smaller than the number needed to achieve the maximum amount of adjustment the set of reference sources is programmed by an incremental amount thus establishing a new set of operation thresholds. This is repeated until either the source current is approximately equal to the reference current or failure occurs. Failure of at least the selected memory element is indicated when the number of programmings is greater than number necessary to effect the maximum amount of adjustment.

In addition, the number of verifications may be counted by a pulse counter which is incremented prior to repeating the verification. The pulse counter is reset after the maximum number of verifications is determined. The number of programmings to the set of reference sources may be counted by referring to a set of registers. The set of registers is incremented anytime after the determination of the number of programmings and prior to repeating the verification.

It is therefore a primary advantage of the present invention to increase the reliability and functionality of the virtual ground array by characterizing at least a portion of the threshold voltages of the memory elements in the virtual ground array and subsequently adjusting operation voltages accordingly.

The following figures and detailed description of the preferred embodiments will more clearly demonstrate these and other objects and advantages of the invention.

DETAILED DESCRIPTION OF THE PRESENTLY PREFERRED EMBODIMENTS OF THE INVENTION

Figure 1A:
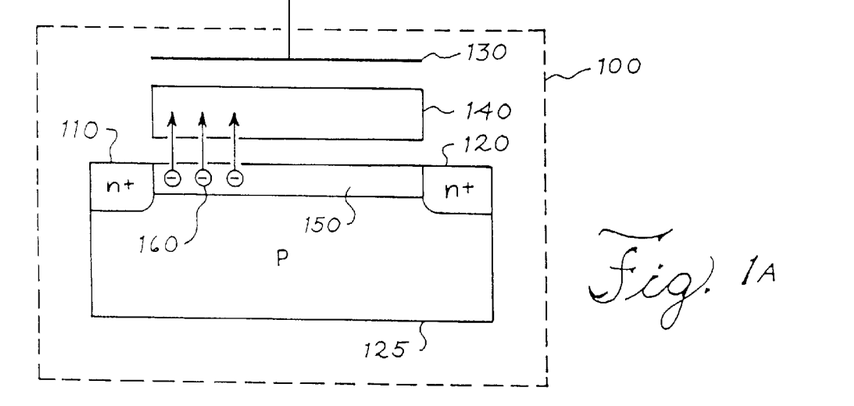
FIG. 1A depicts an individual memory element during a program operation.
Figure 1B:
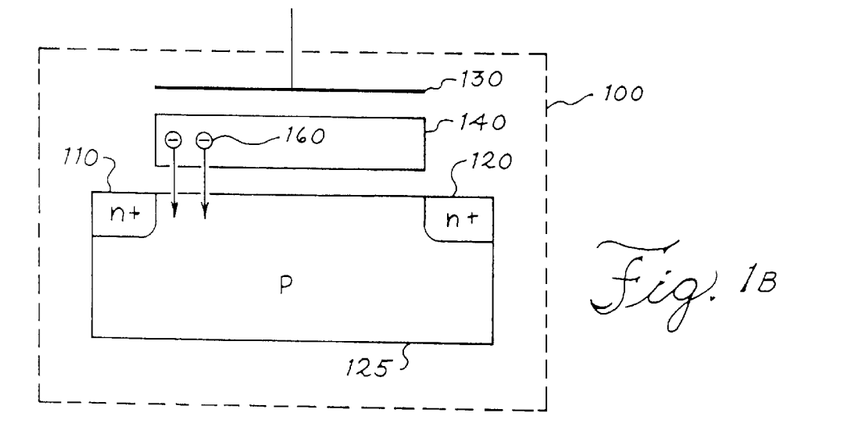
FIG. 1B depicts an individual memory element during an erase operation.
Figure 1C:
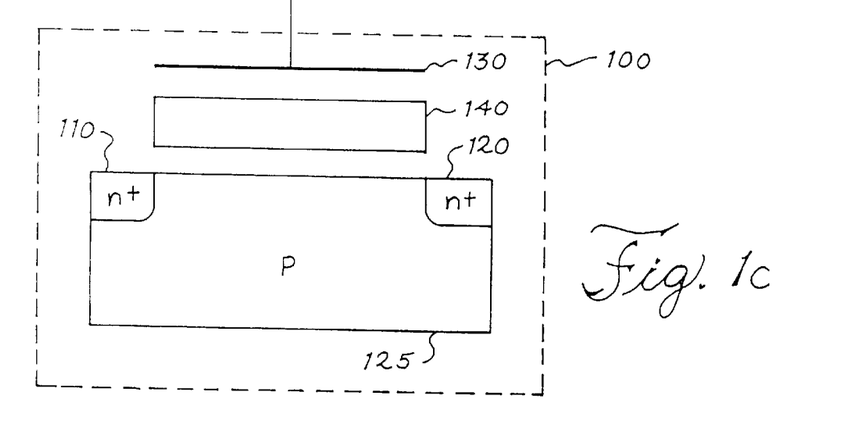
FIG. 1C depicts an individual memory element during a read operation.

The arrangement of the present invention includes essential nonvolatile memory elements. Individual memory elements can undergo three distinct operations, which are shown in FIGS. 1A, 1B and 1C. The three operations are Program, shown in FIG. 1A, Erase, shown in FIG. 1B, and Read, shown in FIG. 1C, and are described below. The following discussions will be limited to n-channel nitride-based non-volatile memory elements. Those ordinarily skilled in the art will appreciate that the basic operations described herein can be applied to a number of non-volatile memory elements, such as standard floating gate technology or multi-bit/cell nonvolatile memory elements in which four states can be programmed. Multi-bit/cell memory elements may be fabricated with an oxide-nitride-oxide (ONO) layer sandwich instead of a poly floating gate layer.

The structure of the memory element 100 is well known in the art: a set of n-type semiconductor junctions comprising the source 110 and drain 120 are disposed within a p-type semiconductor well 125. The memory element 100 further includes a control gate 130 and a floating gate 140. The gates 130, 140 are conventionally formed from polysilicon deposited and patterned on the surface of the substrate, although the floating gate 140 may alternately be formed from a nitride layer. The gates 130, 140 are formed such that an oxide is formed on part of the substrate with the floating gate 140 formed above the oxide. The control gate 130 is formed above the floating gate 140 and isolated from the nitride layer 140 by a second oxide. Control signals are applied to the control gate 130.

During the program operation, as shown in FIG. 1A, the drain 120 is connected with Vss (usually ground) while the source 110 of the memory element 100 is connected with a large voltage, usually >4V. The threshold voltage of the MOSFET may either be a positive or negative voltage which, when exceeded, causes a channel 150 of electrons 160 to exist in the p-type semiconductor well 125. For the case of a negative threshold voltage, the channel 150 exists when the gate 130 is set to Vss in an erased state. The channel 150 is disposed between the source 110 and drain 120 of the memory element 100. A large positive voltage is applied to the control gate 130, which causes electrons 160 to be trapped onto the nitride layer 140 via hot electron injection. The threshold voltage of the transistor is increased if electrons are trapped on the nitride layer 140. The electrons trapped on the nitride layer are usually trapped and immobilized near the source of the electrons, unlike standard floating gate technology, in which a nitride layer is not used and the trapped electrons are mobile along the floating gate.

During the erase operation, as shown in FIG. 1B, the source 110 and the drain 120 of the memory element 100 are set to a moderate voltage, usually 5–6V, while the control gate 130 is set to a moderate negative voltage, usually –5V. As a consequence, the electrons 160 trapped on the floating gate 140 enter the p-type semiconductor well 125 via Fowler-Nordheim tunneling. The threshold voltage thus ideally reverts to the original, unprogrammed threshold voltage of the transistor. Normally, a number of memory elements in a block (for example, the entire virtual ground array or only a sector of, say 512K) will be erased at the same time.

During the read operation, as shown in FIG. 1C, the source 110 of the memory element 100 is connected with Vss, which may be supplied by a bitline, while the drain is connected with a different bitline. The voltage applied to the control gate 130 of the memory element 100 is between the threshold voltage of memory elements that have been erased and memory elements that have been programmed. In one method, a moderate voltage sufficient to turn both an erased and programmed memory element on (say 4V), may be applied to the control gate 130 during a verification or read operation. The current flowing from an erased memory element will be greater than that flowing from a programmed memory element. The current flowing from the memory element 100 may thus be compared to a reference current (which may be set anywhere between that of an erased and programmed memory element). Another method entails, for threshold voltages of erased and programmed memory element of 1V and 3V respectively, applying an intermediate bias of 2V to the control gate 130. In this case, the memory element 100 will be either on or off depending on whether erased or programmed.

As mentioned in the background, the erase threshold voltage of a memory element changes over usage. This is because of charge trapping in the nitride layer or the intermediate oxide. As described above, during programming electrons are trapped locally in the nitride layer near the source of the electrons via hot-electron injection. During erasure, these electrons are ejected from the nitride layer usually via Fowler-Nordheim tunneling.

However, over numerous programming cycles, some of the electrons move toward the center of the nitride and remain trapped on the nitride layer after the completion of the erase cycle (or are trapped in the intermediate oxide). Usually, the number of electrons that remain trapped increases gradually, leading to a small but progressive increase in the threshold voltage. In addition to altering the threshold voltage, the current associated with a memory element being read decreases as well. Eventually, after many programming cycles the threshold voltage increases and current decreases enough to cause errors during reading of the state of the memory element. This will be discussed in more detail after describing the architecture of the system and of the virtual ground array.

Figures 2, 4:
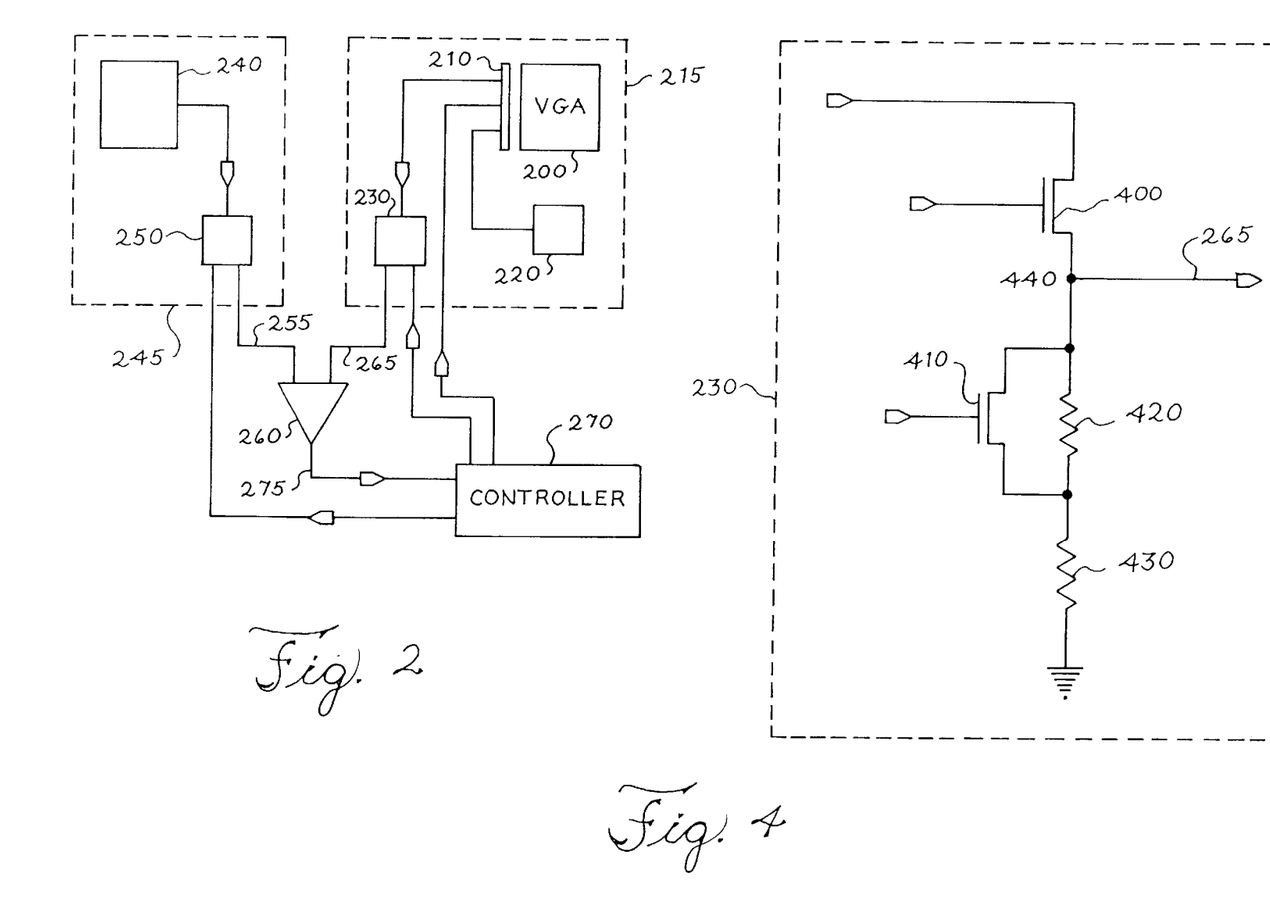
FIG. 2 shows the overall architecture of the characterization arrangement according to the invention.
FIG. 4 shows the architecture of the internal sense circuitry.

The overall system architecture associated with the virtual ground array is shown in FIG. 2. A comparator 260 is used to compare the output from a selected memory element contained in the memory arrangement 215 with the output from a reference circuit 245. The state of the selected memory element is obtained from the output 275 of the comparator. The reference circuit 245 contains a reference current source 240 or an array of reference elements and a reference current-to-voltage circuit 250 for transforming the reference current into a reference voltage 255. The memory arrangement 215 contains a virtual ground array 200 that includes selectable memory elements. A decoding system in the memory arrangement 215 is composed of a plurality of multiplexors and decoders 210 that contain at least one bitline multiplexor and at least one word line decoder. These elements select one of the sensing currents from selected memory elements and routes them either internally toward the comparator 260 or to external control via various I/O pads 220. A selected current is routed internally to a sense current-to-voltage circuit 230 that transforms the sensing current into a sensing voltage on node 265. The reference voltage on node 255 and the sensing voltage on node 265 are input to the comparator 260. A controller 270 processes the output of the comparator 260. The individual elements of the system are described below.

The plurality of decoders and multiplexors 210 comprises decoders and multiplexors necessary to address and route data from the virtual ground array 200. The virtual ground array contains an array of memory elements arranged along intersecting word lines and bitlines. The addressing and routing may use both word line and bitline decoders as well as word line and bitline multiplexors. The word line decoders and multiplexors are used to apply voltages to the gates of particular memory elements contained in the virtual ground array. The bitline decoders and multiplexors are used to select the sources and drains of a different set of memory elements contained in the virtual ground array. Additional routing multiplexors are used to route signals to and from a selected memory element in the virtual ground array between either external I/O pads 220 or to internal comparison circuitry (i.e. toward the comparator 260). Of course, there may be separate source multiplexors and drain multiplexors and odd/even bitline multiplexors, or other sets of multiple multiplexors if the virtual ground array has a large number of memory elements or multiple virtual ground arrays are used.

The placement of the ground in the virtual ground array 200, Vss, may be changed to different sets of nodes, unlike a typical NOR architecture in which Vss is dedicated. Of course, Vss can be an arbitrary voltage rather than ground, which alters the other applied voltages necessary for operation. This is to say that one side of a specific set of non-volatile memory elements contained in the virtual ground array may be held at a predetermined potential during an operation performed on that set of memory elements. After the operation finishes, one side of a different set of non-volatile memory elements may be held at a different (or the same) preset potential during the next operation cycle. The virtual ground array contains an array of memory elements arranged along intersecting word lines and bitlines.

Figure 3:
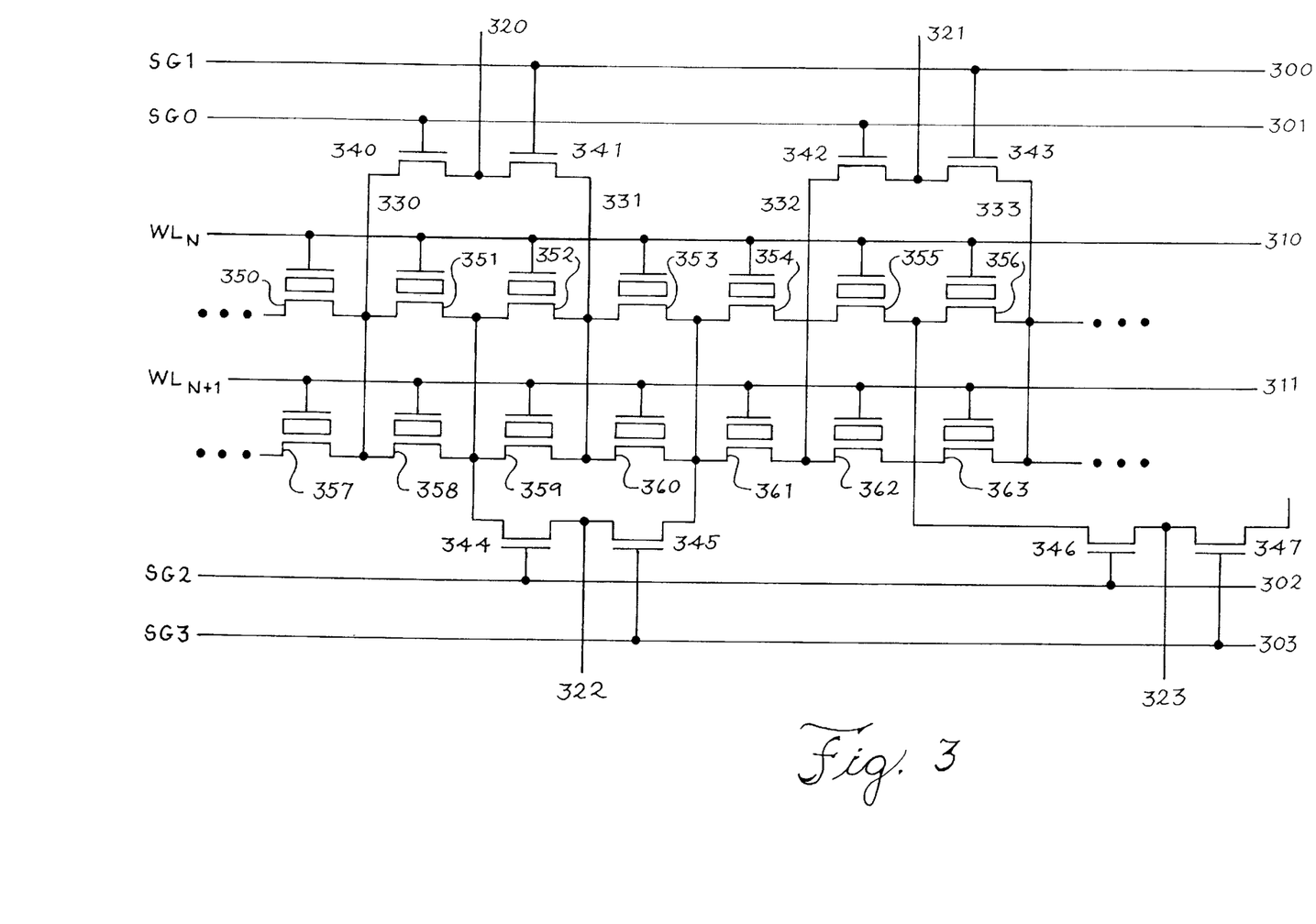
FIG. 3 shows the architecture of a virtual ground array according to the invention.

A section of the architecture of the virtual ground array of the present invention is shown in FIG. 3. The virtual ground array contains memory elements 350–363, select gates 340–347, and lines of communication 300–303, 310–311, 320–323, 330–336 that provide access to the memory elements 350–363 and select gates 340–347. The lines of communication 300–339 are divided up into row lines 300–303, 310–311 and column lines 320–323, 330–336. The row lines consist of word lines 310, 311 that address memory elements 350–363 and select gate lines 300–303 that address the select gates 340–347. The column lines 320–323, 330–336, or bitlines, consist of both global bitlines 320–323, which are connected between the select gates 340–347 and external elements such as the decoders and multiplexors 210, and local bitlines 330–336, which are connected between the select gates 340–347 and the memory elements 350–363.

In the preferred embodiment of the present invention, the global bitlines 320–323 are fabricated using a metal, such as aluminum, gold, or any other metal, alloy, or combination of metals known in the art. The local bitlines 330–336 are fabricated by diffusion of high levels of impurities into the silicon substrate 105 near the location where the memory elements 350–363 and select gates 340–347 are formed. One reason behind using diffusion as local bitlines between memory elements and select gates is that, as die sizes of the overall system architecture shrink and the number of memory elements continues to increase, conservation of real estate on a chip containing the architecture becomes increasingly important. The bitlines formed by diffusion save space as, not only does the virtual ground array not need contacts, but also the local bitlines serve as the source and drain nodes of the virtual ground array. By using diffusion to form local bitlines in the array a small, tight, and contact-less architecture can be fabricated.

As illustrated in FIG. 3, the virtual ground array is arranged such that there are four select gate lines 300–303 and two word lines 310, 311. Usually, the virtual ground array can contain any number of word lines, for example 128 word lines. Each word line has a plurality of memory elements 350–363 arranged in a series such that the source of one memory element 352 is connected with the drain of the next memory element 353. The word lines 310, 311 are connected with the control gate of the memory elements associated with the particular word line. Similarly, the select gate lines 300–303 are connected with the control gates of the select gates 340–347 associated with the particular select gate line. The memory elements contain data i.e. the state of the memory element under certain bias conditions applied to the control gate whether the memory element is programmed or erased.

Pairs of select gates are used to select a particular memory element in order to access the data contained therein. In FIG. 3, the select gate lines are divided into two pairs of select gate lines and the pairs of select gates are connected with one or the other of these pairs of select gate lines. One select gate contained in a pair of select gates is connected with one of the associated pair of select gate lines, while the other select gate contained in the pair is connected with the other select gate line. Each pair of select gates is connected with a set of pairs of memory elements by a pair of local bitlines. Each pair of the set of pairs of memory elements is disposed along a unique word line. The pairs of select gates are connected with the sets of pairs memory elements as follows: pairs of select gates connected with one pair of select gate lines are interleaved with pairs of select gates connected with the other pair of select gate lines.

Thus, as in FIG. 3, a first memory element 351 disposed along a word line 310 is connected between a first and second select gate 340, 344 by a first and second local bitline 330, 334. These select gates 340, 344 are connected with a first and second select gate line 301, 302 contained in two different pairs of select gates. A second memory element 352, adjacent to the first memory element 351, is connected between the second select gate 344 and a third select gate 341. The third select gate 341 is connected with the second memory element 352 by a third bitline 331. The third select gate 341 is connected with the first select gate 340 and a third select gate line 300. The first and third select gates 340, 341 define a first pair of select gates. A third memory element 353 is connected between the third select gate 341 and a fourth select gate 345. The fourth select gate 345 is connected with the third memory element 353 by a fourth bitline 335. The fourth select gate 345 is connected with the second select gate 344 and a fourth select gate line 303. The second and fourth select gates 344, 345 define a second pair of select gates. Thus, the first and second pair of select gates are interleaved along the word line 310.

As mentioned, specific sets of memory elements may be held at different predetermined voltages during different operation cycles. For example, to perform a read on a particular memory element 352, two select gates 341, 344 have voltages sufficient to turn them on supplied to them by two select gate lines 300, 302. One of the global bitlines 322 associated with one of the select gates 302 is held at the supply voltage, consequently setting the voltage at the drain of the memory element 352 being read via the local bitline 334. The word line 310 associated with the memory element 352 supplies the memory element 352 with the read voltage. The data is provided along the local bitline 331 through the select gate 341 to external elements (not shown) via the global bitline 320. Thus, the global bitline 320 contains output data in the form of the amount of sensing current from the selected memory element 352.

As an example, the global bitline associated with the selected memory element is biased to the supply voltage. The select gate voltage is tied to some analog level and the actual drain voltage of the selected memory element is equal to the select gate voltage minus the threshold voltage. Thus, for example, a global bitline connected with the drain of the select gate is set to about 3V. If the voltage applied to the gate of the select gate is about 2½V and the normal threshold voltage of the select gate is about 1V, the drain voltage of the selected memory element is around 1½ volts. The source voltage of the selected memory element is usually close to ground.

The decoders and multiplexors 210 of FIG. 2 select the desired sensing current and subsequently pass the current to the sense current-to-voltage circuit 230 to produce the sensing voltage on node 265 (FIG. 2). Only one valid sensing current per output will exist because only one pair of global bitlines per output is selected, i.e. the other bitlines will float and thus no current path will exist for the other bits. In addition, a plurality of multiplexors and column decoders are necessary if there is a large number of active global bitlines to decode. Column decoders decode external addresses to produce signals that decode the bitline multiplexor. Thus, for the virtual ground array, the decoders and multiplexor must select two bitlines for every address. As described above, one of the bitlines associated with the address serves as the source and one of the bitlines associated with the address serves as the drain. However, in applications where a byte or word is read at one time, multiple pairs of memory elements may be selected for each address.

FIG. 4 depicts the architecture of the sense current-to-voltage circuit 230. The sensing current is tied to the drain of an output-activation transistor 400. The source of the output-activation transistor 400 is tied to an optional resistor 420. A bypass transistor 410 is used to vary the resistance necessary to transform the sensing current into a voltage. A set resistance 430 is connected between ground and the source of the bypass transistor 410. When the bypass transistor 410 is off, the sensing current flows through both an optional resistor 420 connected between the source and drain of the bypass transistor 410 and the set resistance 430. When the bypass transistor 410 is on, the sensing current bypasses the optional resistor 420 and only flows though the set resistance 430. The sensing voltage on node 265 is determined at a sensing node 440, which is disposed between the source of the output-activation transistor 400 and the drain of the bypass transistor 410. The sensing voltage on node 265 may thus be varied according to the desired range of voltage at the comparator 260. Of course, there can be any number of bypass transistors and optional resistors with different resistor values, as desired. Similarly, the resistors can be replaced with any elements (e.g. a capacitor) that provide the desired resistances. A similar arrangement can be used for the reference current-to-voltage circuit 250 to produce the reference voltage on node 255. The reference current source 240 can essentially be anything that produces a constant current, e.g. a current source, a standard memory element that is only used during comparison operations, etc. The preferred embodiment uses reference memory elements dedicated for the erase, read, and program operations.

The resistances used to convert the various currents to voltages in the current-to-voltage circuits may be changed to alter the margin during a verification of an erase or program operation. This is to say that, after erasing or programming some of the memory elements, it is necessary to subsequently verify that the memory elements were erased or programmed to the correct threshold levels. As the resistances are variable, different resistances can be used to determine the state of the selected memory element depending on the operation. Changing the sense resistance, reference resistance, or both varies the sense ratio. Thus, by increasing the resistance on the sense side, the sense current necessary to detect the current from a selected memory element is decreased i.e. the signal margin to the comparator 260 is increased. For example, applying the same voltage to the control gate of the memory element after a program results in a smaller current than after an erase because of the increase in threshold voltage. Thus, by increasing the sense resistance during a program verify, the same sense voltage can be maintained. Similarly, the reference resistance can be changed and the optimal mix of variation to alter the signal margin to the comparator 260 may be determined based on the current expected.

In addition, the resistances may be varied due to the non-ideality of the comparator 260 or to adjust for changes in the sensing current. Variations in the sensing current occur as charge trapping occurs. Charge trapping will eventually take place in the nitride as the memory element is perpetually programmed and erased. The threshold voltage of the memory element increases as a result of charge trapping. As the amount of charge trapped increases, the same voltage applied to the gate of the selected memory element will drive a decreasing amount of current. Thus, to maintain the same margin to the comparator 260, either the resistance in the sensing circuit must be increased or the resistance in the reference circuit must be decreased if no other measures are taken.

However, the resistance method above is only one way to measure the current. The resistances essentially transform direct current into voltage. This means they are stable, but slow and sink power. Using capacitors, or AC current, is a much faster method that also consumes less power. The charge on the capacitors increases in direct proportion to the amount of current flowing. This charge can be measured to obtain a voltage, which is compared in a similar way to the voltage obtained from a reference capacitor/current source combination.

The comparator 260 subsequently compares the sensing voltage on node 265 and the reference voltage on node 255. The comparator 260 will not be described herein as any standard comparator may be used. In general, the comparator will be some type of differential amplifier with an active mirror circuit. The controller 270 uses the output of the comparator 260 to determine the threshold voltage for the selected memory element. The controller 270 also automatically adjusts the window placement, i.e. operational voltages, of the selected memory element if necessary. Additionally, the controller 270 controls the overall addressing of the virtual ground array 200, and the various resistances in the reference current-to-voltage circuit 230 and sense current-to-voltage circuit 250. The controller 270 includes a finite-state machine and registers that contain the current operating levels.

The description of the internal characterization and auto adjustment operation follows. As discussed, specific sets of memory elements may be sensed during different operation cycles. For example, to perform a read of a particular memory element 352, two select gates 341, 344 (FIG. 3) have voltages sufficient to turn them on supplied to them by two select gate lines 300, 302. One of the global bitlines 322 associated with one of the select gates 302 is grounded, thus grounding the source of the memory element 352 being read via the local bitline 334. The word line 310 associated with the memory element 352 supplies the memory element 352 with the necessary reading voltage and the data is provided along the local bitline 331 through the select gate 341 toward the comparator 260 via the global bitline 320. Thus, the global bitline 320 contains output data in the form of the amount of sensing current from the selected memory element 352.

After an erase operation is performed, the threshold voltage of the desired memory element must be characterized to determine if it has attained the proper original level. The verification of the threshold level after the erase operation, or erase verify, is necessary to maintain stable operational characteristics. During characterization of the threshold voltages the decoders and multiplexors 210 select the drain and control gate of the memory element to which controller-controlled internal voltage supplies (not shown) apply voltages. The drain voltage of the selected memory element is between 1 and 2 volts, nominally 1.1 V. The voltage applied to the control gate via the word line associated with the selected memory element is between 0 and 5 volts, nominally 4V for a verification operation. The threshold voltages may be verified after the memory elements have been erased or programmed. As above, the memory elements are erased in blocks and then individually characterized. Although the memory elements could be erased and characterized individually, the erase operation takes a few hundred milliseconds and verification of a memory element requires less than a microsecond and thus erasing all of the memory elements prior to verification saves a large amount of time.

Specifically, to determine the threshold voltage of erased memory element 352, select gate lines SG0 (select gate 341) and SG1 (select gate 344) are activated. The global bitlines 320, 322 associated with the select gates 341, 344 are respectively connected with the drain and source of the memory element 352. One of the global bitlines 320 sets voltage of the drain to 1V, and a voltage is applied along the associated word line 310 to the control gate of the memory element 352. Over time the threshold voltage of the memory element will increase from the initial value due to charge trapping, as discussed above. Thus, as the charge builds up, it becomes increasingly difficult to erase the device to the original threshold level. As before, the erase verify operation is performed after each attempt at erasing the memory element to the original threshold level. Failure occurs when current from the source of the memory element is less than the erase verify reference current even after a maximum number of erase/erase verify operations. Once failure of the tested erased memory element occurs, the window placement is adjusted automatically for all operations in the virtual ground array thereafter. However, the placement can only be finitely adjusted because there is a limitation on the amount of voltage applied to read the memory element (i.e. supply enough current for sensing). Further, the time to program the device increases as the voltage being programmed to increases.

Figure 5:
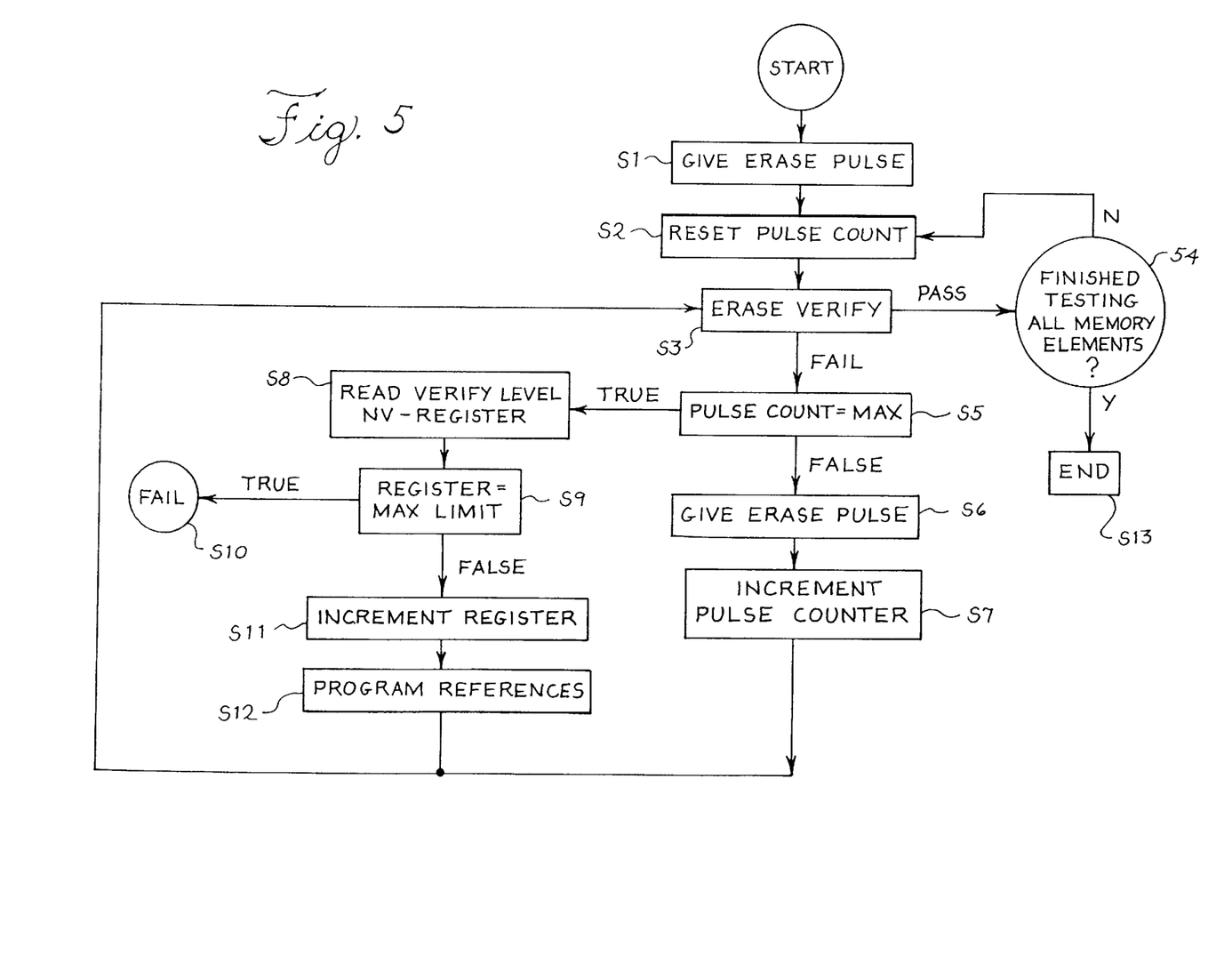
FIG. 5 shows a flowchart of the method of the primary embodiment.

A flowchart of the automatic adjustment method is shown in FIG. 5. The method begins after the block of memory elements is erased S1. A pulse counter is reset S2 and the current of the selected memory element is compared to a reference current obtained from a reference memory element under the same bias conditions S3. The reference memory element is erased and compared to the threshold determined by the selected memory element verified immediately prior to the presently selected memory element. This is to say that if, during the last erase verify routine, the erase threshold of the selected memory element was determined to be not the original threshold of 1V, but 1.1V, the new erase threshold of the erased reference memory element would be 1.1V. If the current from the presently selected memory element is approximately the reference current, the memory element passes and the routine moves to the next memory element and restarts the sequence S4. If the last memory element in the block has been tested, the program ends S13 and either another block can be tested or other operations may be performed. However, if the current from the presently selected memory element deviates significantly (i.e. is substantially less than) the reference current, the pulse counter is examined S5. If the pulse counter has not reached the maximum number of repetitions allotted for verification S5, another erase pulse is supplied to the block of memory elements S6, the pulse counter increments S7, and the program attempts to verify the memory element again S3 (i.e. tests the current). However, if the pulse counter has reached the maximum number of repetitions allotted for verification S5, adjustment of the reference level is automatically performed S8–12. Thus, the erase verify routine repeats a predetermined number of times before adjustment is automatically performed.

The adjustment proceeds by reading a set of registers that contain the threshold to which the reference memory element is presently programmed S8. The reference memory element has a maximum amount it can be adjusted before overall failure of the virtual ground array occurs. If the register already contains the maximum threshold S9 and the routine indicates adjustment is again necessary, the device fails S10. However, if the register contains a level below the maximum level and the routine indicates adjustment is necessary, the register is incremented S11. After the register is incremented, all the reference memory elements are adjusted. The reference memory elements are programming in incremental steps S12 and the erase verify sequence S3 is restarted for the memory element. Example settings include: initial erase threshold=1V, voltage between operations=1V, max. no. of erase verify=100, programming incr.=0.1V, and max. no. of adjustments=8. In this example, the erase threshold of the erase reference memory element may be incremented to 1.8V, and the verify thresholds of the other reference memory elements are then adjusted by the same increment as the erase reference memory element. In addition, this means that three registers are required (000= 1V, 001=1.1V, 010=1.2V, etc . . . ). Alternatively, adjustment could occur after a failure during testing of a programmed memory element (program verify) or during reading of the memory element. Usually there are three reference memory elements (erase, read, and program) for verification during each operation, which are all adjusted and depend on the present state of the registers.

Figure 6:
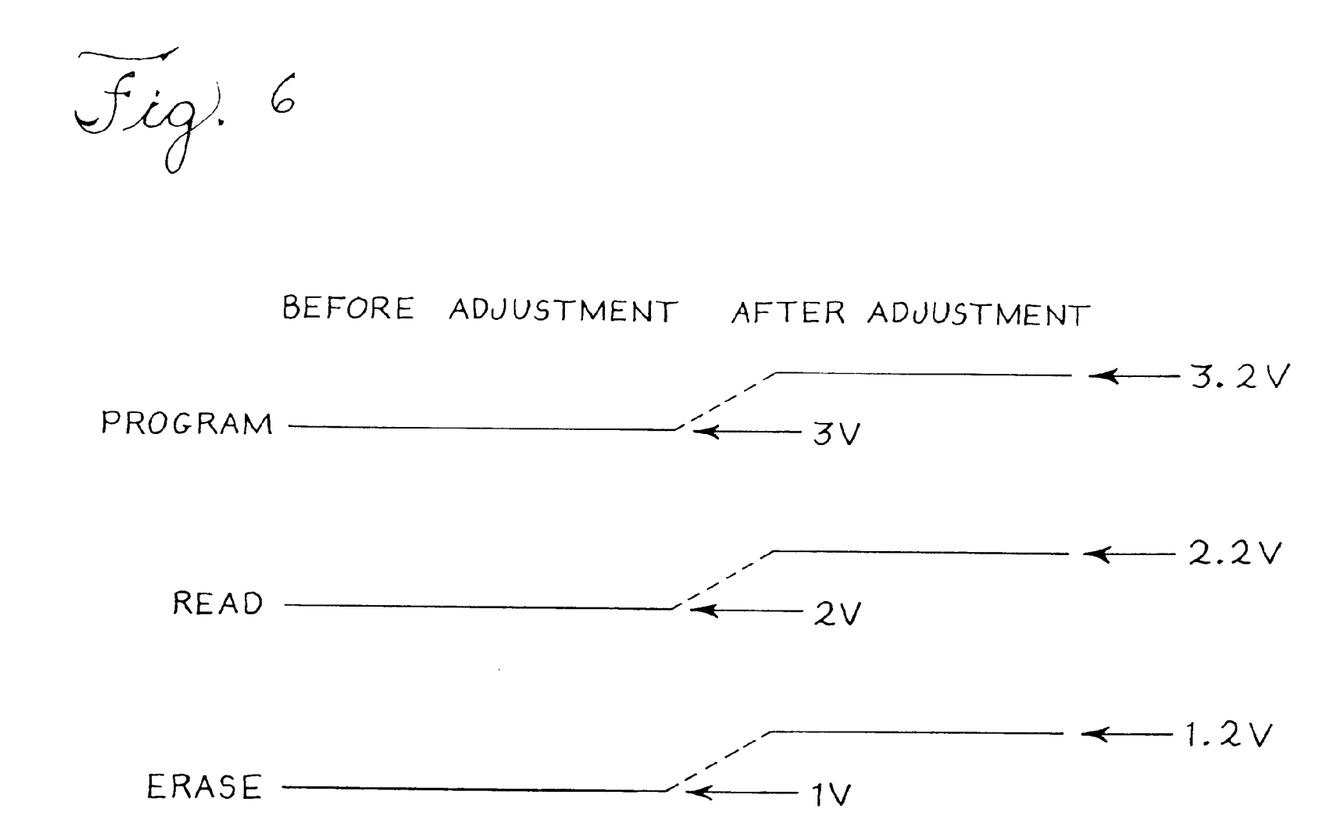
FIG. 6 illustrates an operating window before, during, and after an adjustment of the operating window.

The adjustment scheme depicted in FIG. 5 alters the operating window as shown in FIG. 6. FIG. 6 illustrates an example of variation of the operating window by showing the original window placement before adjustment and the shifted placement after adjustment. Before adjustment the memory element cannot be erased to the original level (1V). By adjusting the reference memory elements, the window of operating conditions is relaxed or shifted by a predetermined amount such that the voltage differences between the erase, program, and read operations are returned to the original values before failure.

The preferred embodiment of the invention provides a method of automatically adjusting the window placement of operation voltages for a memory element contained in a virtual ground array using current from the source of a specific memory element. In addition to providing increased endurance and reliability, the auto-adjustment method also provides a means of decreasing errors due to erase verify failure in the virtual ground array, and saves both power consumption and processor time.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

We claim:

1. A method of automatically adjusting the placement of a window of operating voltages applied to memory elements in a virtual ground array, the method comprising:

selecting a set of memory elements contained in the virtual ground array;

determining a current from the source of the selected memory element; and adjusting placement of a window of operating voltages to the selected memory element in response to the current determined, the window of operating voltages having a range of operating voltages containing, in order of increasing voltage, an erasing voltage, a reading voltage, and a programming voltage of the selected memory.

2. The method of claim 1 wherein the determining comprises:

transforming the source current into a sense voltage via a sense transforming means;

transforming a reference current into a reference voltage via a reference transforming means, the reference current originating from one of a set of reference sources; and comparing the sense voltage and reference voltage via a comparitor.

3. The method of claim 2 further comprising controlling at least one of the sense transforming means and the reference transforming means, the sense transforming means and the reference transforming means consisting of resistors, transistors or capacitors.

4. The method of claim 3, wherein the adjusting comprises:

verifying that the selected memory element is erased to a sufficient erase voltage;

determining a number of verifications when the selected memory element is not erased to the current erase voltage;

re-erasing the selected memory element when the number of verifications is determined to be smaller than a predetermined amount of verifications; and repeating the verifying, determining, and re-erasing.

5. The method of claim 4 wherein the adjusting further comprises:

determining a number of programmings applied to the reference source when the number of verifications is determined to be larger than the predetermined amount of verifications;

programming the set of reference sources by an incremental amount to set a new current erase voltage when the number of programmings is determined to be smaller than a maximum number of programmings necessary to effect a maximum amount of adjustment; and indicating failure of at least the selected memory element when the number of programmings is greater than the maximum number of programmings.

6. The method of claim 5 wherein the adjusting further comprises:

counting the number of verifications of the selected memory element prior to re-erasing;

incrementing a pulse counter prior to repeating; and resetting the pulse counter after the predetermined amount of verifications is attained.

7. The method of claim 6 wherein the adjusting further comprises:

counting the number of programmings of the selected memory element prior to programming; and incrementing a set of registers prior to repeating.

8. The method of claim 7 further comprising repeating the acts of determining the current and adjusting for each memory element in the set of selected memory elements.

9. The method of claim 8 further comprising erasing at least the memory elements contained in the set of selected memory elements prior to determining the current.

10. A method of automatically adjusting the placement of a window of operating voltages applied to memory elements in a virtual ground array, the method comprising:

selecting a set of memory elements contained in the virtual ground array;

erasing a selected memory element in the set of memory elements;

comparing a source current of the selected memory element with a reference current supplied from one of a set of reference sources;

re-erasing the selected memory element when the source current is less than the reference current and a number of comparisons is smaller than a predetermined amount of comparisons;

programming the reference sources by an incremental amount when the number of comparisons is greater than a predetermined amount of comparisons and a number of programmings is smaller than a set number of programmings necessary to effect a maximum amount of adjustment;

resetting the number of comparisons after programming;

repeating the acts of comparing, re-erasing, programming, and resetting when the number of programmings is smaller than the set number;

continuing the acts of comparing, re-erasing, programming, resetting and repeating for each memory element in the set of memory elements; and indicating failure of the virtual ground array when the number of programmings is greater than the set number;

wherein placement of the window of operating voltages is adjusted by programming, the window of operating voltages having a range of operating voltages containing, in order of increasing voltage, an erasing voltage, a reading voltage, and a programming voltage of the virtual ground array and the reading voltage minus the erasing voltage after adjustment is greater than the maximum amount of adjustment.

* * * * *